United States Patent [19]
Johnson

[11] Patent Number: 6,163,582
[45] Date of Patent: Dec. 19, 2000

[54] DIFFERENTIATOR, RECTIFIER, MIXER, AND LOW-PASS FILTER CIRCUIT

[75] Inventor: Luke A. Johnson, Tempe, Ariz.

[73] Assignee: Intel Corporation, Santa Clara, Calif.

[21] Appl. No.: 08/940,456

[22] Filed: Sep. 30, 1997

[51] Int. Cl.[7] .................................................. H04L 7/00
[52] U.S. Cl. ........................................ 375/354; 327/165
[58] Field of Search ................................. 375/354, 376; 327/165

[56] References Cited

U.S. PATENT DOCUMENTS

| | | | |
|---|---|---|---|
| 5,012,494 | 4/1991 | Lai et al. ............................ | 375/376 |
| 5,164,966 | 11/1992 | Hershberger ....................... | 375/359 |
| 5,594,763 | 1/1997 | Nimishakavi ...................... | 376/376 |
| 5,666,388 | 9/1997 | Neron ................................. | 375/376 |
| 5,671,258 | 9/1997 | Burns et al. ....................... | 375/359 |
| 5,812,619 | 9/1998 | Runaldue .......................... | 375/376 |

OTHER PUBLICATIONS

Behzad Razavi, "A 2.5–Gb/s 15–mW Clock Recovery Circuit", IEEE Journal of Solid–State Circuits, vol. 31, No. 4, pp. 472–480, Apr. 1996.

*Primary Examiner*—Don N. Vo
*Assistant Examiner*—Phuong Phu
*Attorney, Agent, or Firm*—Blakely, Sokoloff, Taylor & Zafman LLP

[57] ABSTRACT

An improved clock recovery circuit is disclosed. A first inverter pulse generator and a second inverter pulse generator for receiving nonreturn-to-zero (NRZ) data and in response thereto generating a signal having a frequency (f) is provided. A differential pair that is coupled to the first and second inverter pulse generators for mixing the signal provided by the pulse generators and a clock signal is provided.

18 Claims, 6 Drawing Sheets

DIFFERENTIATOR, RECTIFIER, MIXER, AND LOW-PASS FILTER CIRCUIT

BACKGROUND OF THE INVENTION

1. Field of the Invention

The invention relates generally to high-performance communication systems and specifically to a high-speed, low-power differentiator, rectifier, mixer, and low-pass filter (DRML) circuit.

2. Description of the Related Art

Random nonreturn-to-zero (NRZ) data contains no spectral component at its fundamental data frequency (hereinafter referred to as "f"). For example, FIG. 1 illustrates a magnitude versus frequency graph illustrating random nonreturn-to-zero (NRZ) data generated at a clock frequency of 1 GHz. As illustrated in FIG. 1, the NRZ data includes spectral components at one-half the clock frequency (½ f), but the even harmonics have a null magnitude. Consequently, frequencies of ½*f, 3/2*f, 5/2*f, etc. are prevalent, but the desired 2/2*f or simply f (1 GHz) is missing.

In order to address this problem, clock recovery circuits (CRCs) are employed to extract the fundamental data frequency from a nonreturn-to-zero (NRZ) data sequence. A conventional approach for extracting the frequency f is to employ a separate differentiator circuit, a rectifier circuit, a mixer circuit and a low-pass filter circuit. An example of this approach is described in the IEEE Journal of Solid State Circuits, Vol. 31, No. 4, April 1996, entitled, "A 2.5-Gb/s 15-mW Clock Recovery Circuit", by Behzad Razavi.

However, this approach has several disadvantages. First, because each function requires a separate circuit, and each circuit is relatively complex, a large number of transistors are needed. For example, in the Razavi circuit, the differentiator alone requires four (4) transistors and the mixer circuit, alone, requires four (4) additional transistors. The large number of transistors translates to a large area requirement for the clock recovery circuit. Moreover, the conventional approach requires more DC current for operation, thereby increasing the power consumption for the circuit. Furthermore, the conventional circuits require a higher power supply voltage since the components (i.e., differentiator circuit, rectifier circuit, mixer circuit and low-pass filter) are stacked on top of each other.

Accordingly, there remains a need in the industry for an improved CRC that 1) can be implemented with fewer transistors and a reduced area, 2) reduces power consumption and 3) is adapted for low voltage operation.

SUMMARY OF THE INVENTION

An improved clock recovery circuit is disclosed. A first inverter pulse generator and a second inverter pulse generator for receiving nonreturn-to-zero (NRZ) data and in response thereto generating a signal having a frequency (f) is provided. A differential pair that is coupled to the first and second inverter pulse generators for mixing the signal provided by the pulse generators and a clock signal is provided.

BRIEF DESCRIPTION OF THE DRAWINGS

The objects, features and advantages of the method and apparatus for the present invention will be apparent from the following description in which.

DETAILED DESCRIPTION OF THE INVENTION

Referring to the figures, exemplary embodiments of the invention will now be described. The exemplary embodiments are provided to illustrate aspects of the invention and should not be construed as limiting the scope of the invention. The exemplary embodiments are primarily described with reference to block diagrams and schematic diagrams. As to the schematic diagrams, specific circuit elements (e.g., transistors, capacitors, resistors) are illustrated. Depending upon the implementation, the transistors can be p-devices, n-devices or combinations thereof. Moreover, it will be known to one of ordinary skill in the art that a particular circuit functionality can be implemented in other different ways.

The present invention provides an improved differentiator, rectifier, mixer and low-pass filter (DRML) circuit that has increased performance, reduced power requirements and reduced area requirements. The present invention has numerous applications in a variety of fields. In any system that communicates nonreturn-to-zero data, the present invention can be employed to extract the clock signal associated with the data.

For example, the present invention can be used in networking applications (e.g., local area networks (LAN)) and can, for example, be implemented in a hub or a networking computer card.

The present invention can also be used in a system in which components of that system communicate with each other via a high speed serial bus. In such an application, the present invention can be implemented in a transceiver integrated circuit that converts the high speed serial data into lower speed parallel digital data. The present invention provides an improved DRML circuit which can be implemented into a clock recovery circuit. The increased performance, reduced power requirements, and reduced area requirements for the DRML circuit of the present invention translates into a higher performance clock recovery circuit. Accordingly, any application requiring the recovery of a clock from nonreturn-to-zero data can benefit from the present invention.

Figure 1:
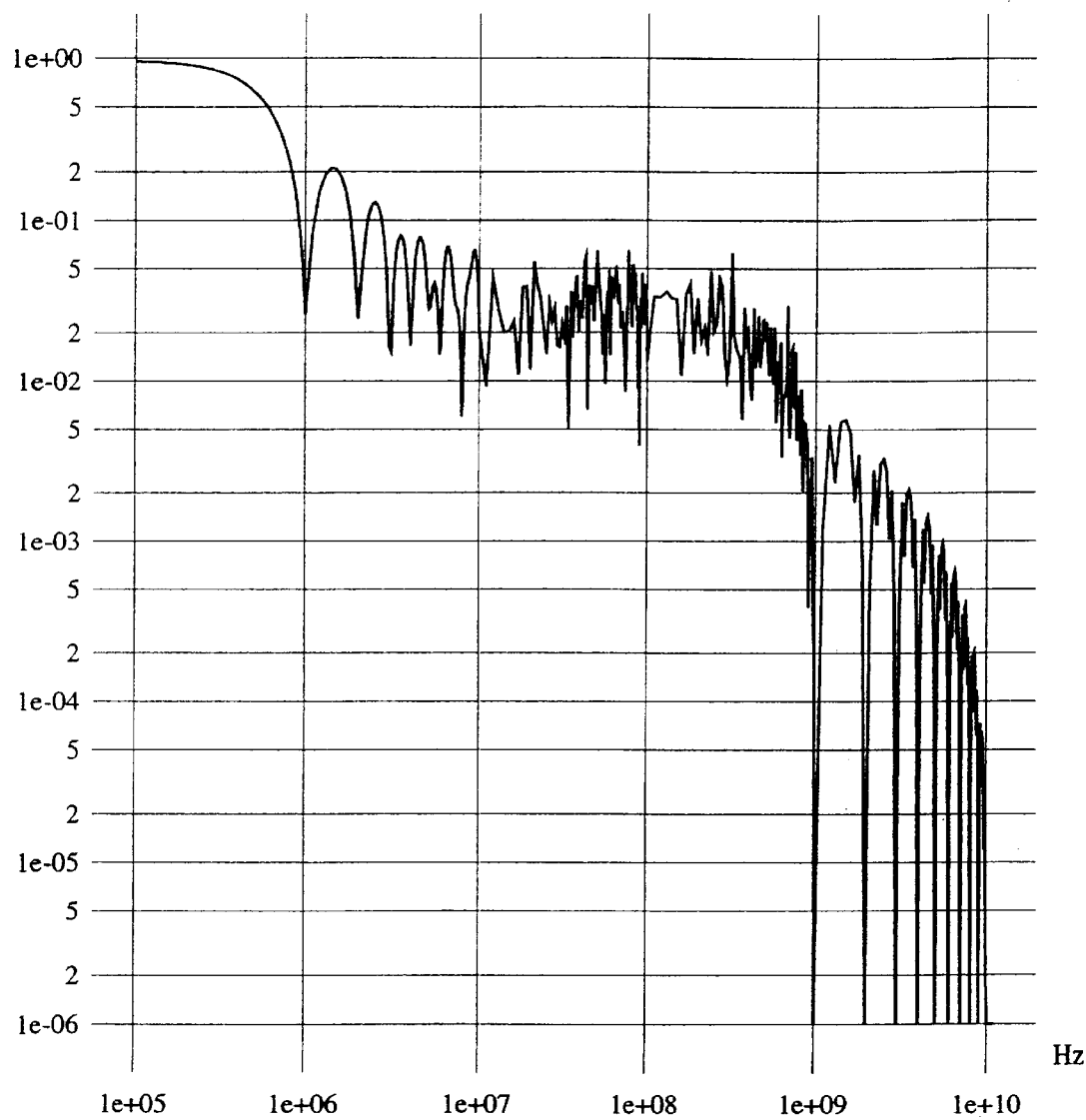
FIG. 1 is a magnitude versus frequency graph illustrating random nonreturn-to-zero (NRZ) data.
Figure 2:
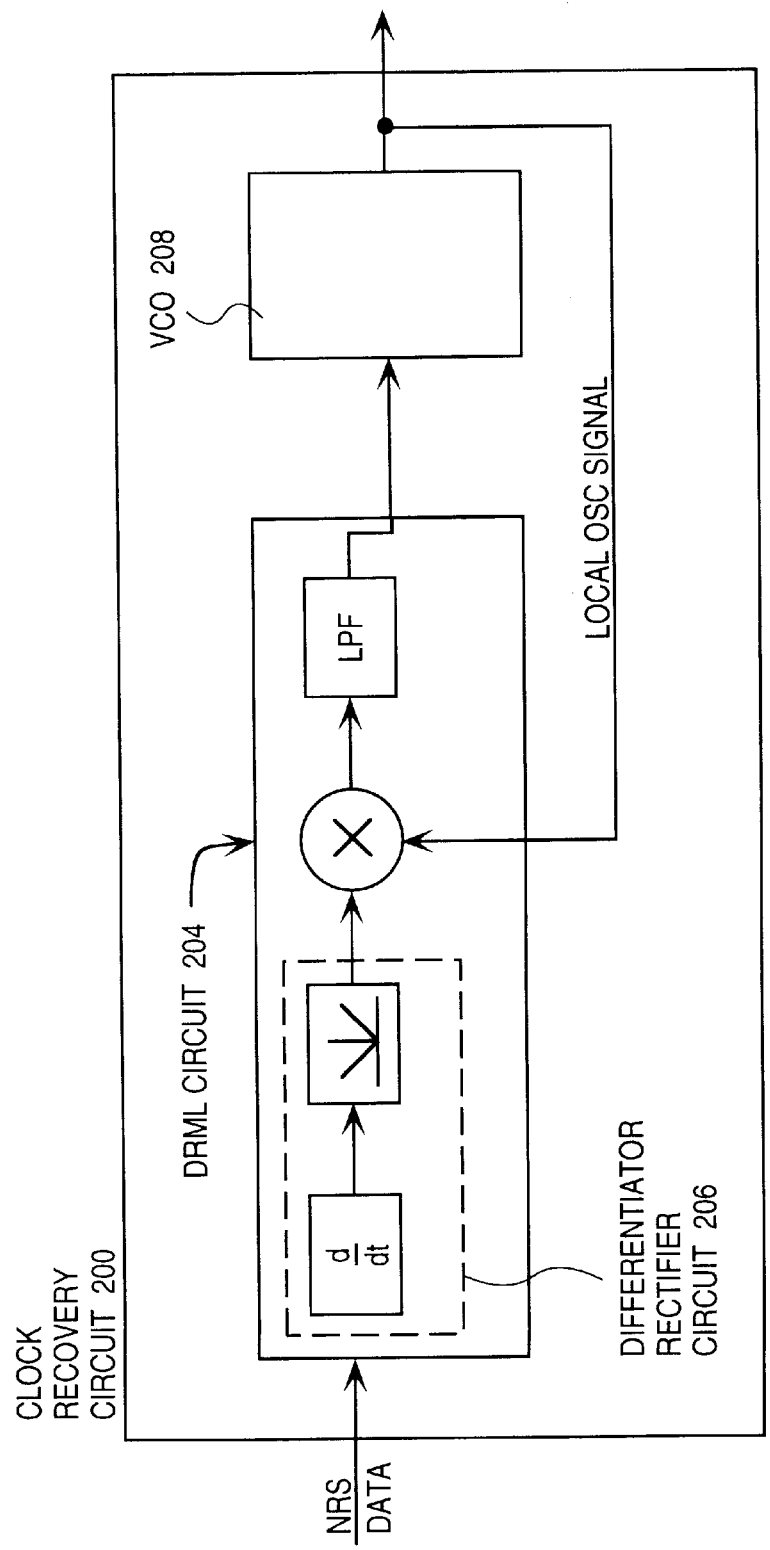
FIG. 2 illustrates a clock recovery circuit in which the present invention can be implemented.

FIG. 2 illustrates a clock recovery circuit 200 in which the present invention can be implemented. The clock recovery circuit 200 includes a Differentiator, Rectifier, Mixer and Low Pass Filter (hereinafter referred to as "DRML") circuit 204 of the present invention. The clock recovery circuit 200 also includes a Voltage Controlled Oscillator (VCO) 208 for receiving an input from the DRML circuit 204 and responsive thereto providing a local oscillator clock signal to the DRML circuit 204. The DRML circuit 204 includes a first input for receiving the NRZ data and a second input for receiving the local oscillator clock signal from the VCO 208. The DRML circuit 204 performs the following functions on the NRZ data:

1) differentiation of the NRZ data;
2) rectification of the differentiated NRZ data;
3) multiplication of the differentiated and rectified NRZ data with the local clock signal; and
4) low pass filtering of the product of (3).

The DRML circuit 204 of the present invention also includes the differentiator/rectifier circuit 206 that performs the differentiation and rectification of the NRZ data (steps 1 and 2) illustrated above.

The improved DRML circuit of the present invention provides all the above function with fewer transistors, less area, and less power than conventional circuits.

Figure 3:
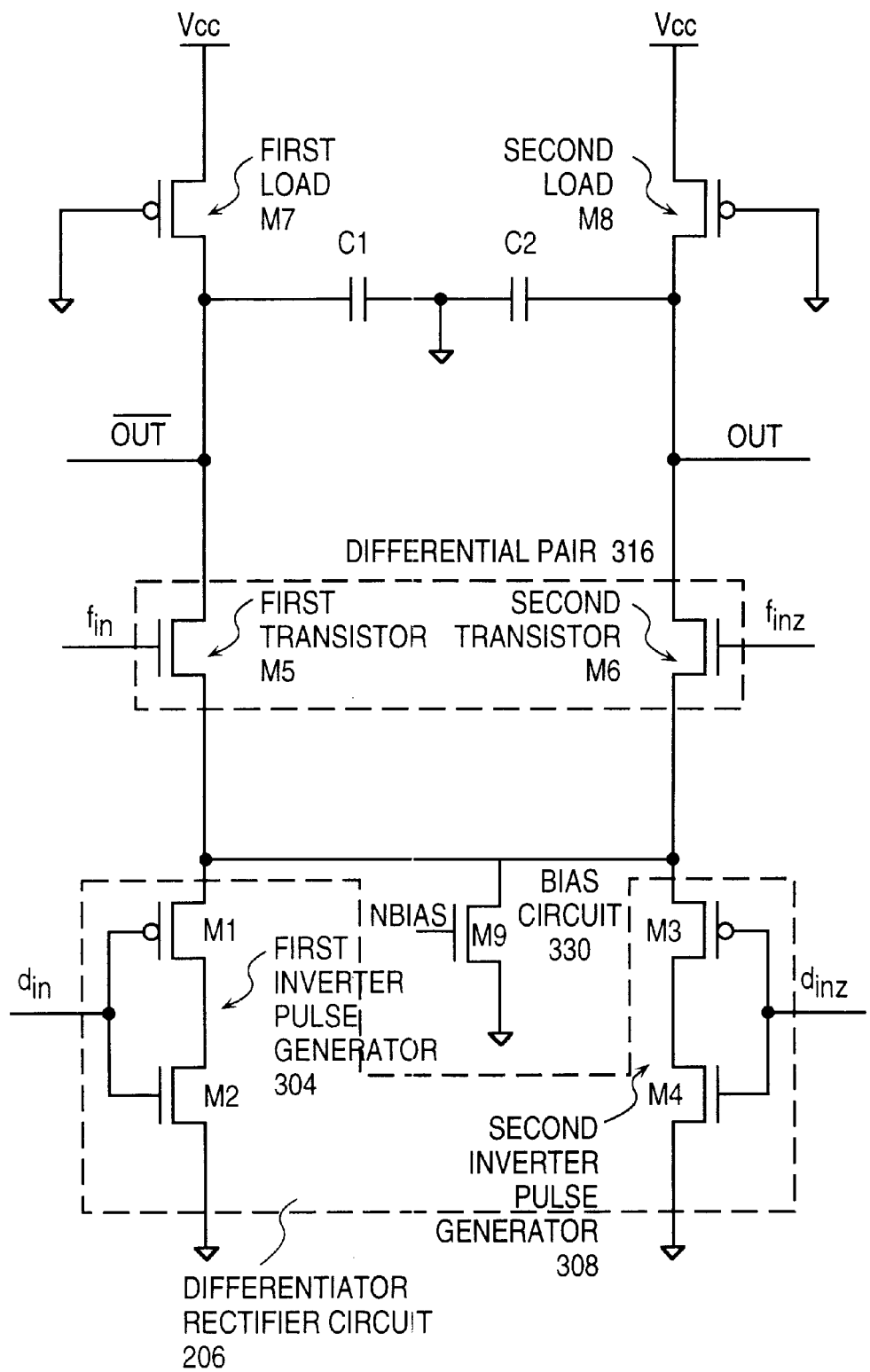
FIG. 3 is a schematic diagram of the DRML circuit configured in accordance with one embodiment of the present invention.

FIG. 3 is a schematic diagram illustrating the improved DRML circuit 204 of the present invention configured in accordance with the teachings of one embodiment of the present invention. The DRML circuit 204 includes a differentiator/rectifier circuit 206 that performs the differentiation and rectification operation. The differentiator/rectifier circuit 206 includes a first inverter pulse generator 304 and a second inverter pulse generator 308. The first inverter pulse generator 304 includes a first input for receiving nonreturn-to-zero (NRZ) data (DIN), a second input for receiving a first predetermined voltage (e.g., $V_{SS}$ or a ground potential), and a third output for sinking a current pulse from a differential pair 316, which will be described in greater detail hereinafter. The first inverter pulse generator 304 can be implemented with a PMOS transistor M1 and an NMOS transistor M2.

The second inverter pulse generator 308 includes a first input for receiving an inverted NRZ data signal (DINZ), a second input for receiving the first predetermined voltage (e.g., $V_{SS}$ or a ground potential), and a third output for sinking a current pulse from the differential pair, which will be described in greater detail hereinafter. The second inverter pulse generator 308 can be implemented with a PMOS transistor M3 and an NMOS transistor M4.

The improved DRML circuit 204 of the present invention 300 also includes a differential pair 316 for providing the mixing operation. The differential pair 316 includes a first transistor M5 and a second transistor M6. The first transistor M5 includes a gate electrode for receiving a clock signal (FIN) that can be provided from a voltage controlled oscillator (not shown). The first transistor M5 also includes a source electrode coupled to the third input of the first inverter pulse generator 304, and a drain electrode for providing an inverted mixer output (OUTZ) that has a frequency (f).

The second transistor M6 includes a gate electrode for receiving the inverted nonreturn-to-zero data (FINZ), a source electrode coupled to the second input of the second inverter pulse generator 308, and a drain electrode for providing a mixer output signal (OUT) having a frequency (f).

The DRML circuit 204 of the present invention also includes a low-pass filter. The low-pass filter includes a first and second capacitor and a first and second load (M7 and M8). In this embodiment, the first load 320 is implemented with a PMOS transistor M7, and the second load 324 is implemented by a PMOS transistor M8. The first load M7 includes a gate electrode coupled to the first predetermined (e.g., $V_{SS}$ or a ground potential), a source electrode coupled to a second predetermined voltage (e.g., $V_{CC}$, which in this embodiment is approximately 1V), and a drain electrode coupled to the drain electrode of the first transistor M5. The second load M8 includes a gate electrode coupled to the first predetermined voltage, a source electrode coupled to the second predetermined voltage, and a drain electrode coupled to the drain electrode of the second transistor M6. A first capacitor C1 and a second capacitor C2 can be coupled in series between the output node (OUT) and the inverted output node (OUTZ). It will be understood by those of ordinary skill in the art that a single load and a single capacitor can provide the low-pass filtering function.

The improved DRML circuit 204 also includes a bias circuit 330 for biasing the differential pair. The bias circuit 330 can be implemented with a NMOS transistor M9. A transistor M9 includes a drain electrode coupled to the common node of the differential pair (M5 and M6). The common node is also coupled to the, a source electrode coupled to the first predetermined voltage, and a gate electrode for receiving a bias signal (NBIAS). Transistor M9 provides bias for the DRML circuit 204.

The improved DRML circuit 204 of the present invention employs the first inverter pulse generator 304 and the second inverter pulse generator 308 to modulate the gain of the differential pair 316. The first inverter pulse generator 304 and the second inverter pulse generator 308 are subject to a pulse of current through transistors M1, M2, M3, and M4, respectively, while the inverter switches. The inverter-type pulse generator is coupled to the source of device M5 and M6 and sinks current from the common node outputs the source current of either the P device or the N device on the common node. Each time the data switches, the differentiator/rectifier circuit 206 provides a current spike to the differential pair (M5 and M6), resulting in a temporary increase in the differential pair gain.

It will be apparent to those of ordinary skill in the art the differentiator/rectifier circuit 206 can be configured to source current to the common node instead of sinking current from the common node. The effect of providing a current spike is maintained in either case.

When the potential across the source terminal of the p-device and the n-device of the inverter is less than the sum of the PMOS threshold voltage and NMOS threshold voltage (approximately 1V), the first inverter pulse generator 304 and the second inverter pulse generator 308 behave like a switched capacitor circuit that transfers a set amount of charge in two steps through the inverter. When the input VIN is high, the intermediate node is grounded through the N device (respectively, transistors M2 and M4). When the input switch is low, the N device turns off and a set amount of charge is transferred onto the intermediate node through the P device (respectively, transistors M1 and M3). By employing the first inverter pulse generator 304 and second inverter pulse generator 308 in this manner, with complementary inputs, a weighted pulse of charge can be delivered to the DRML circuit 204 differential pair each time the input switches. This pulse of charge modulates the differential gain to provide the mixing operation.

The DRML circuit 204 includes a first output and a second output for generating a complimentary signal pair. The OUT signal and the OUTZ signal present a differential output (i.e., the output is the difference between the OUT signal and the OUTZ signal). The output waveform (OUT and OUTZ) includes the spectral signature needed by the improved DRML circuit 204.

As noted previously, the DRML circuit 204 of the present invention performs four tasks: 1) differentiation, 2) rectification, 3) multiplication (also referred to as mixing), and 4) filtering. The output of the DRML circuit 204 includes spectral components equal to the difference between the NRZ fundamental data frequency and the local oscillator frequency.

An important operation of a improved DRML circuit 204 is to mix a signal containing the desired frequency (f) with the output of a voltage controlled oscillator. Because the present invention employs the inverter pulse generators (304, 308) to provide the signal having the desired frequency (f), a differential pair 316 can be employed to provide the mixing operation. Since the transconductance (gm) of a device increases as the current through the device increases, the transconductance of transistors M5 and M6 increase when the first inverter pulse generator 304 and the second inverter pulse generator 308 pulse extra current through transistors M5 and M6, respectively. Gain is simply the resistance multiplied by the transconductance (R1×gm), where R1 is the resistance of the load devices transistors M7 and M8. Consequently, the gain of the first transistor M5 and the second transistor M6 is increased for a short period of time each time the NRZ data (DIN and DINZ) changes. The gain is applied to the clock signal provided by the voltage control oscillator to provide the desired mixing operation.

The improved DRML circuit 204 of the present invention is advantageous for at least the following reasons. First, only eight transistors are needed to provide a signal having the desired frequency component (f) and the mixing operation. The small number of transistors translates to a small area requirement to implement the improved DRML circuit 204 of the present invention. Second, the improved DRML circuit 204 of the present invention dissipates less power and operates at a lower supply voltage. The low power requirements stem from the fact that no DC current is required to keep the differentiating and rectifying portion of the present invention in the operating region. The improved DRML circuit 204 of the present invention also can operate at low operating voltages since the differentiating and rectifying portion is coupled to the bias transistor M9 in parallel and not in series.

As discussed previously, the improved DRML circuit 204 of the present invention has wide applications in networking, communication and mass storage applications. The improved DRML circuit 204 of the present invention enables a computer device (e.g., a network card) to interface with a high speed bus (e.g., a 1 GHz fiber optic bus) while expending low power.

Figure 4:
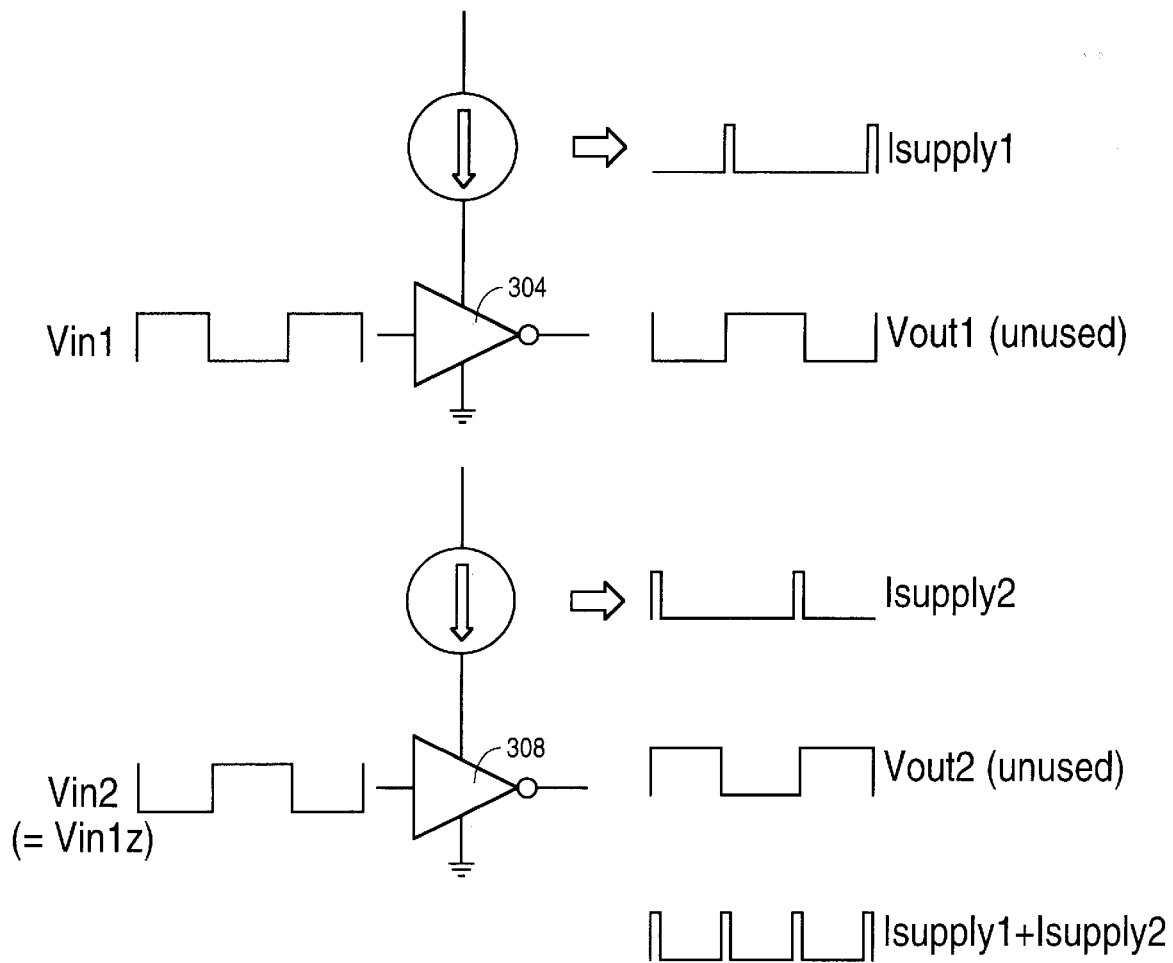
FIG. 4 illustrates a diagram that shows how the present invention sums the supply currents of two inverters.

FIG. 4 illustrates a diagram that shows how the present invention sums the supply currents of two inverters. Summing the supply currents of the first inventor 304 and the second inventor 308 results in a current waveform having the needed fundamental data frequency component. As noted previously, the first inventor 304 and the second inventor 308 have complimentary inputs.

Figure 5:
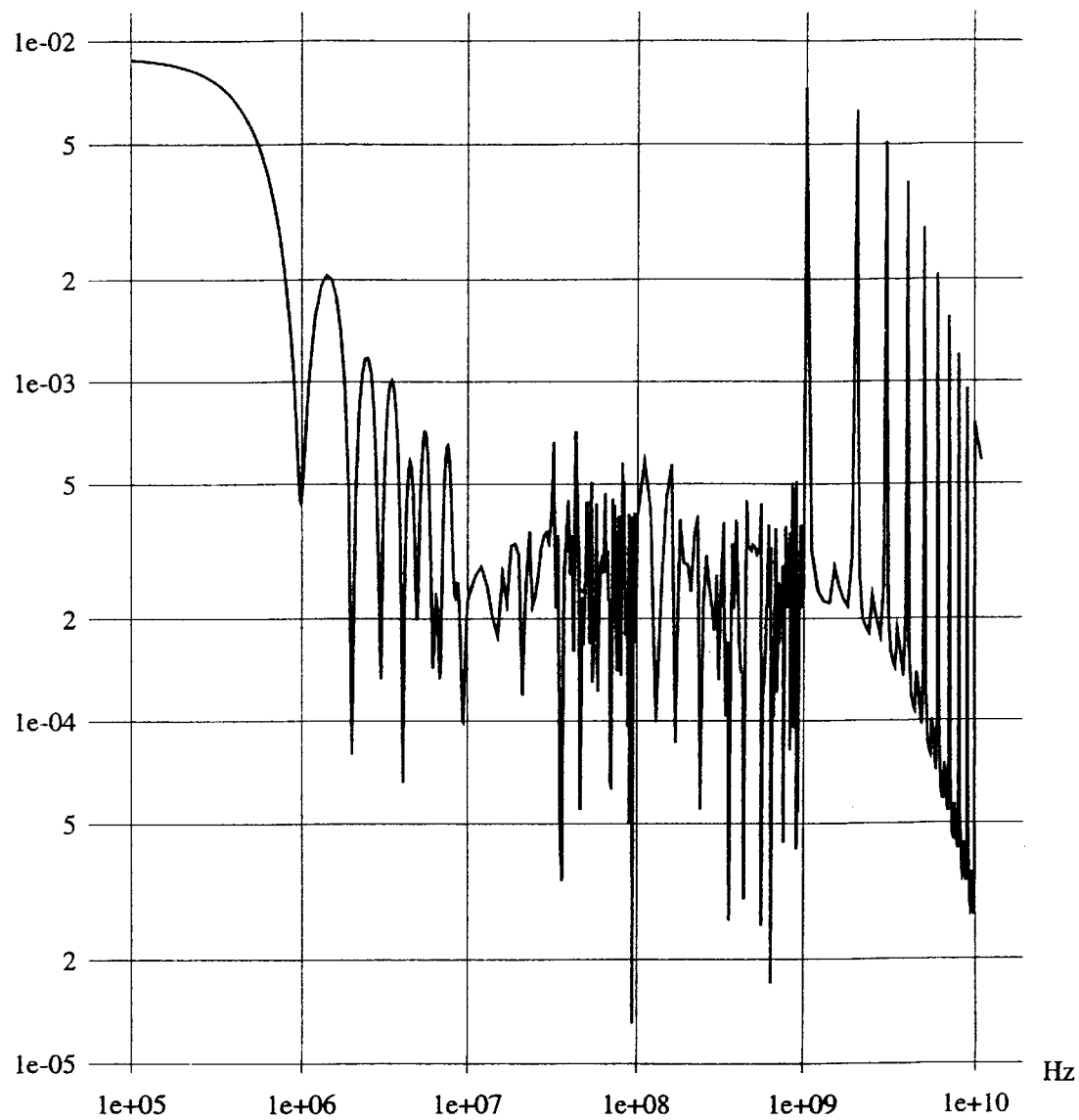
FIG. 5 is a magnitude versus frequency graph illustrating the summed inverter currents of FIG. 4.

FIG. 5 is a magnitude versus frequency graph illustrating the summed inventor current of FIG. 4. This graph clearly illustrates that the summed inventor current, as described previously, includes a strong component at the fundamental data frequency (f), where in this case f is 1 GHz.

Figure 6:
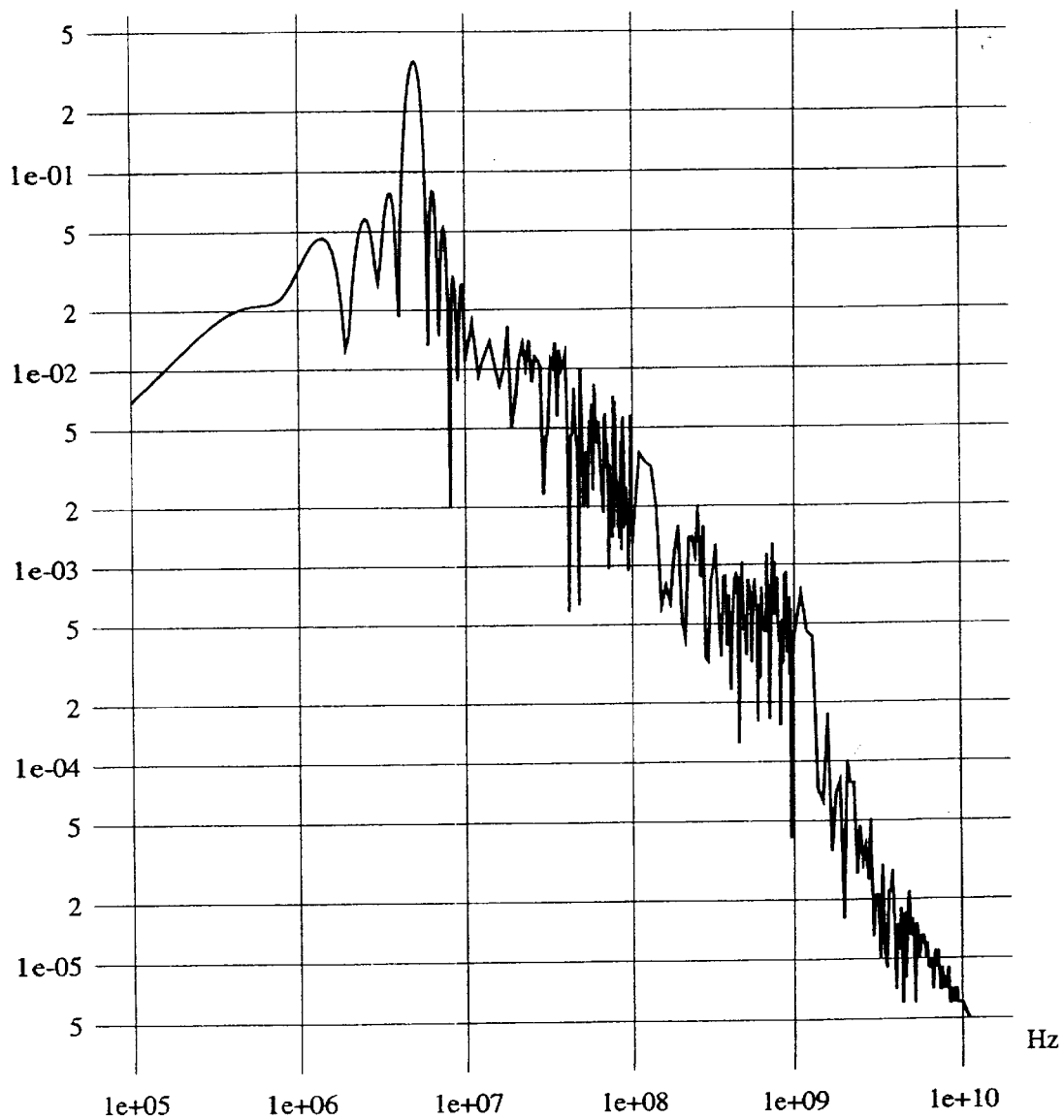
FIG. 6 is a magnitude versus frequency graph of the mixer output that verifies the mixer operation.

FIG. 6 is a magnitude versus frequency graph of the mixer output that verifies the operation of the present invention. The graph illustrates the mixer output where the mixer is provided a local oscillator frequency of approximately 995 MHz by the VCO 208. The existence of a beat component at 5MHz (i.e., 1000 MHz–995 MHz) verifies the operation of the present invention.

In the foregoing specification, the invention has been described with reference to specific exemplary embodiments thereof. It will, however, be evident that various modifications and changes may be made thereto without departing from the broader sprit and scope of the invention as set forth in the appended claims. For example, although FIG. 3 illustrates one implementation that employs NMOS transistors for the differential pair and two inverter pulse generators for the differentiator/rectifier circuit, it will be understood by those of ordinary skill in the art that these functional blocks can be implemented with different devices and still provide the functions and principles taught by the present invention. Moreover, FIGS. 4, 5 and 6 illustrate the characteristics and behavior of one embodiment of the present invention. Although specific numerical values are shown, it will be understood by those of ordinary skill in the art that the specific numerical values for these graphs will change, depending on the specification implementation of the present invention. Accordingly, the exemplary embodiments described herein are provided merely to illustrate the principles of the invention and should not be construed as limiting the scope of the invention. Rather, the principles of the invention may be applied to a wide range of systems to achieve the advantages described herein and to achieve other advantages or to satisfy other objectives as well.

What is claimed is:

1. A differentiation, rectification, mixer circuit comprising:
   a) a first inverter pulse generator and a second inverter pulse generator for receiving nonreturn-to-zero (NRZ) data and in response thereto generating a signal having a frequency (f); and
   b) a differential pair coupled to the first and second inverter pulse generators for mixing said signal having a frequency (f) and a clock signal; the differential pair includes:
      a first transistor having a gate electrode for receiving a clock signal, a drain electrode for providing an inverted output signal, said inverted output signal having a frequency (f), and a source electrode coupled to the output of the first inverter pulse generator and the output of the second inverter pulse generator; and
      a second transistor having a gate electrode for receiving an inverted clock signal, a drain electrode for providing an output signal, said output signal having a frequency (f), and a source electrode coupled to the output of the first inverter pulse generator and the output of the second inverter pulse generator.

2. The differentiation, rectification, mixer circuit of claim 1 further comprising a first load coupled to the drain of the first transistor.

3. The differentiation, rectification, mixer circuit of claim 2 further comprising a second load coupled to the drain of the second transistor.

4. The differentiation, rectification, mixer circuit of claim 2 wherein the first load is a PMOS device.

5. The differentiation, rectification, mixer circuit of claim 3 wherein the second load is a PMOS device.

6. The differentiation, rectification, mixer circuit of claim 1 further comprising a first and second capacitor coupled in series between the drain electrode of the first transistor and the drain electrode of the second transistor.

7. The differentiation, rectification, mixer circuit of claim 1 further comprising a third transistor for providing bias to the source of the first transistor and the second transistor.

8. The differentiation, rectification, mixer circuit of claim 1 wherein the first inverter pulse generator includes a PMOS device and an NMOS device.

9. The differentiation, rectification, mixer circuit of claim 1 wherein the second inverter pulse generator includes a PMOS device and an NMOS device.

10. A clock recovery circuit comprising:
   a) a voltage controlled oscillator (VCO) for providing a location oscillator signal; and b) a differentiation, rectification, mixer circuit, coupled to the VCO, said differentiation, rectification, mixer circuit including:
  i) a first inverter pulse generator and a second inverter pulse generator for receiving nonreturn-to-zero (NRZ) data and in response thereto generating a signal having a frequency (f); and
  ii) a differential pair, coupled to the first and second inverter pulse generators for mixing said signal having a frequency (f) and a clock signal, the differential pair includes:
    a first transistor having a gate electrode for receiving a clock signal, a drain electrode for providing an inverted output signal, said inverted output signal having a frequency (f), and a source electrode coupled to the output of the first inverter pulse generator and the output of the second inverter pulse generator; and
    a second transistor having a gate electrode for receiving an inverted clock signal, a drain electrode for providing an output signal, said output signal having a frequency (f), and a source electrode coupled to the output of the first inverter pulse generator and the output of the second inverter pulse generator.

11. The clock recovery circuit of claim 10 further comprising a first load coupled to the drain of the first transistor.

12. The clock recovery circuit of claim 11 further comprising a second load coupled to the drain of the second transistor.

13. The clock recovery circuit of claim 11 wherein the first load is a PMOS device.

14. The clock recovery circuit of claim 12 wherein the second load is a PMOS device.

15. The clock recovery circuit of claim 10 further comprising a first and second capacitor coupled in series between the drain electrode of the first transistor and the drain electrode of the second transistor.

16. The clock recovery circuit of claim 10 further comprising a third transistor for providing bias to the source of the first transistor and the second transistor.

17. The clock recovery circuit of claim 10 wherein the first inverter pulse generator includes a PMOS device and an NMOS device.

18. The clock recovery circuit of claim 10 wherein the second inverter pulse generator includes a PMOS device and an NMOS device.

* * * * *